(12) United States Patent
Barnett et al.

(10) Patent No.: US 8,847,574 B2
(45) Date of Patent: Sep. 30, 2014

(54) ELECTRICAL ISOLATORS

(75) Inventors: Iain Barnett, Lasswade (GB); Jonathan Ephraim David Hurwitz, Edinburgh (GB); William Michael James Holland, Edinburgh (GB)

(73) Assignee: Broadcom Europe Limited, London (GB)

( * ) Notice: Subject to any disclaimer, the term of this patent is extended or adjusted under 35 U.S.C. 154(b) by 278 days.

(21) Appl. No.: 13/498,086

(22) PCT Filed: Sep. 23, 2010

(86) PCT No.: PCT/GB2010/051598
§ 371 (c)(1),
(2), (4) Date: Mar. 30, 2012

(87) PCT Pub. No.: WO2011/036490
PCT Pub. Date: Mar. 31, 2011

(65) Prior Publication Data
US 2012/0230074 A1    Sep. 13, 2012

(30) Foreign Application Priority Data

Sep. 24, 2009  (GB) .................................. 0916763.6

(51) Int. Cl.
*H04B 3/00* (2006.01)
*H04B 3/56* (2006.01)

(52) U.S. Cl.
CPC ........................................ *H04B 3/56* (2013.01)
USPC ............................... 323/364; 307/89; 361/313

(58) Field of Classification Search
USPC ............................... 323/364; 307/89; 361/313
See application file for complete search history.

(56) References Cited

U.S. PATENT DOCUMENTS

| | | | |
|---|---|---|---|
| 7,054,372 B2 * | 5/2006 | Davis | ............................ 375/251 |
| 2007/0080587 A1 | 4/2007 | Ruizenaar | |
| 2009/0002067 A1 | 1/2009 | Kronberg | |

OTHER PUBLICATIONS

International Search Report, PCT/GB20101051598, Dec. 10, 2010, 3 pages.

* cited by examiner

*Primary Examiner* — Harry Behm
*Assistant Examiner* — Matthew Grubb
(74) *Attorney, Agent, or Firm* — Garlick & Markison; Bruce E. Garlick

(57) ABSTRACT

Disclosed is an electrical isolator circuit comprising an input stage comprising first and second inputs, the input stage being configured to receive an input voltage signal; an output stage comprising first and second outputs electrically connected across a load capacitor; and a DC isolator comprising a first capacitor between said first input and said first output and second capacitor between said second input and said second output. The first and second plates of each of the first, second and load capacitors are defined by conductive layers of a printed circuit board and the dielectric of each of the first, second and load capacitors are defined by a non-conducting part of the printed circuit board.

20 Claims, 4 Drawing Sheets

ELECTRICAL ISOLATORS

FIELD OF THE INVENTION

The present invention relates to a low power electrical isolator circuit operable to provide isolation of a low voltage circuit from a high voltage circuit whilst providing for coupling of an analogue signal from the high voltage circuit to the low voltage circuit.

BACKGROUND TO THE INVENTION

Mains voltage powered consumer products, such as multimedia home networking nodes, are required for reasons of safety to have electrical isolation between mains voltage circuitry and low voltage circuitry. Despite the electrical isolation there is often a need to convey signals across the electrical isolation barrier between the mains voltage circuitry and the low voltage circuitry.

The determination of a location, such as a zero crossing point, on the mains voltage signal from the low voltage side is an example of such a need involving the conveyance of signals from the high voltage side to the low voltage side. The determination of a location on the mains voltage signal finds application, for example, in providing for synchronisation with a mains voltage cycle. Synchronisation with the mains voltage cycle may be used to provide for synchronised communication between and amongst low voltage circuits of multiple networked products, such as multimedia home networking nodes. The determination of a location on the mains voltage signal may also find application in monitoring the phase variation of a mains supply to determine whether or not the mains supply is liable to fail. For example, there may be an increased likelihood of failure in supply if there is more than a 2% variation in the phase of a mains supply from a twenty-four mean. Precautionary measures may then be taken, such as the engagement of an uninterruptable power supply.

Another example of such a need involving the conveyance of signals from the high voltage side to the low voltage side is the measurement on the low voltage side of the voltage level on the high voltage side, e.g. to determine variations in the mains supply voltage level over time.

Isolator circuits are known, but these tend to suffer from problems of high power dissipation, high expense and/or excessive size.

It is therefore an object for the present invention to provide an electrical isolator circuit that addresses at least one of the above drawbacks.

STATEMENT OF INVENTION

According to a first aspect of the present invention there is provided an input stage comprising first and second inputs, the input stage being configured to receive an input signal;
an output stage comprising first and second outputs electrically connected across a load capacitor; and
a DC isolator comprising a first capacitor between said first input and said first output and second capacitor between said second input and said second output; wherein
first and second plates of each of the first, second and load capacitors are defined by conductive layers of a printed circuit board and the dielectric of each of the first, second and load capacitors are defined by a non-conducting part of the printed circuit board.

Said first, second and load capacitors may be defined by four of said conductive layers, all of which at least partially overlap with each other, such that one of said conductive layers defines a first of said plates of said load capacitor and one of said plates of said first capacitor, and another of said conductive layers defines a second of said plates of said load capacitor and one of said plates of said second capacitor.

A first plate of the first capacitor may be defined by a first surface layer on a first surface of the printed circuit board, the first plate of the second capacitor may be defined by a second surface layer on a second opposite surface of the printed circuit board, the second plate of the first capacitor and the first plate of the load capacitor may both be defined by a first embedded layer within the printed circuit board and the second plate of the second capacitor and the second plate of the load capacitor may both be defined by a second embedded layer, the first and second embedded layers being spaced apart from each other.

Said first and second surface layers may only partially overlap said first and second embedded layers, while said first and second embedded layers may substantially totally overlap each other. In this way, the area of overlap of the layers which define the first and second capacitors can be made smaller than the area of overlap of the layers which define the load capacitor. Also, the first and second embedded layers may be spaced apart from each other to an extent less than the spacing between each of the first surface layer and the first embedded layer and of the second surface layer and the second embedded layer. These arrangements mean that the load capacitor can be made considerably larger than the first and second capacitors, as is desirable, even when using embedded layers that each have similar areas and dimensions.

In its proposed use, the first and second capacitors of the DC isolator couple the high voltage AC signal to the load capacitor to provide a DC isolated representation of the high voltage AC signal across the load capacitor. The first and second capacitors may be configured such that the first and second capacitors form a potential divider with the load capacitor to provide an attenuated representation of the high voltage AC signal across the load capacitor. Capacitors in the form of discrete components that are suitable for the coupling of a high voltage AC signal to a load capacitor, and for the load capacitor itself, tend to be expensive. Hence, the printed circuit board defined (i.e. non discrete) first, second and load capacitors of the present invention can provide a lower cost alternative to discrete first and second capacitors. Electrical circuits of at least one of high voltage AC circuits and low voltage circuits may be mounted on and interconnected by means of the printed circuit board that defines the first, second and load capacitors.

The electrical isolator circuit according to the present invention normally has a lower power dissipation than an opto-isolator circuit on account of the large impedance presented by the first and second capacitors at the low frequencies typical of mains AC signals. Thus and more specifically, the input stage may be configured to receive a high voltage AC signal having a frequency of less than 500 Hz, such as a frequency of substantially 60 Hz or substantially 50 Hz for domestic mains or a frequency of substantially 400 Hz for mains in ships. The electrical isolator circuit according to the present invention is of smaller size than transformer based electrical isolators. In particular, the formation of the first, second and load capacitors of the present invention in a printed circuit board offers a cost advantage over known electrical isolators.

Alternatively or in addition, the input stage should be configured to receive a high voltage AC signal, which in the context of the present invention may be an AC voltage of 50 Vrms or greater according to standards defined by the International Electrotechnical Commission, such as an AC voltage of substantially 110 Vrms or substantially 230 Vrms. Thus, the high voltage AC signal may be a domestic mains voltage signal or a mains voltage signal in a ship.

Alternatively or in addition, the output stage should be operable at a low voltage signal, which in the context of the present invention may be an AC voltage of less than 50 Vrms or a DC voltage of less than 120 V according to standards defined by the International Electrotechnical Commission. More specifically, the low voltage signal may be a DC voltage of less than substantially 15 volts, such as a voltage of 12 volts. More specifically, the low voltage signal may be a DC voltage of substantially 5 volts or less.

Alternatively or in addition, each of the first and second capacitors may have a capacitance of less than 100 pF. More specifically, each of the first and second capacitors may have a capacitance of less than 50 pF. More specifically, each of the first and second capacitors may have a capacitance of less than 10 pF, such as substantially 5 pF. As regards power dissipation, substantially no power is dissipated in the capacitors.

Said load capacitor may have a capacitance of between substantially 20 pF and substantially 1 nF.

Alternatively or in addition, the input stage may comprise a rectification circuit, such as a diode or a bridge rectifier, which is operative to rectify a high voltage AC signal before it reaches the DC isolator.

Alternatively or in addition, the input stage may comprise a resistive divider operative to reduce a voltage level of a high voltage AC signal applied to the input stage.

Alternatively or in addition, the electrical isolator circuit may further comprise an electrical source that is operative to provide a high voltage AC signal to the input stage. The electrical source may, for example, be an electrical tap taken from a mains power supply.

BRIEF DESCRIPTION OF DRAWINGS

Further features and advantages of the present invention will become apparent from the following specific description, which is given by way of example only and with reference to the accompanying drawings, in which.

DETAILED DESCRIPTION OF THE EMBODIMENTS

Figure 1A:
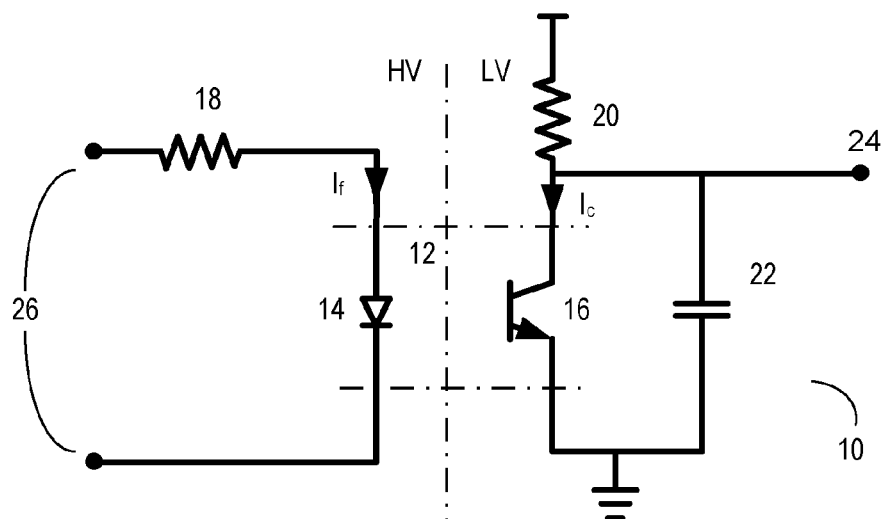
FIG. 1A is a circuit diagram of a first known electrical isolator circuit.

FIG. 1A shows a known electrical isolator circuit 10 for conveying signals from a mains voltage circuit to a low voltage circuit whilst maintaining isolation between the mains and low voltage circuits. The electrical isolator circuit 10 comprises an opto-isolator 12 having an infrared light emitting diode (LED) 14 and a photo-transistor 16. A resistor, 18 in series with the LED 14 limits the current flowing through the LED 14. A load resistor, 20 is present in series with the photo-transistor 16 between the photo-transistor and the positive power line. A capacitor, Capacitor 22, represents a parasitic capacitance of the electrical circuit connected to the output 24 of the photo-transistor. In use, a high voltage AC signal is applied across the inputs 26 to the electrical isolator circuit to thereby cause operation of the LED 14. Light emitted by the LED is received by the photo-transistor and causes a current to flow in the photo-transistor with the current developed across the load resistor to thereby provide a corresponding voltage at the output 24.

A disadvantage of the electrical isolator circuit of FIG. 1A is its high power dissipation on the low voltage side and, in particular, on the high voltage side. The temporal accuracy of the output 24 depends on the speed at which the isolator circuit 10 is capable of switching with the switching speed being determined by the RC time constant of resistor 20 and capacitor 22. The maximum value of resistor 20 can be determined for a given load and a desired accuracy. The maximum value of resistor 20 and the required voltage swing in turn determine the minimum required photo-transistor current, Ic. The LED forward current, If, is then determined on the basis of the current transfer ratio (CTR) of the opto-isolator having regards to the photo-transistor current, Ic. For high voltage signals, most of the voltage is dropped across Resistor 18. A power dissipation of 0.5 Watts can be expected for a typical opto-isolator and typical values for resistor 20 and Resistor 18. If the forward current, If, is reduced to a significant extent to reduce the power dissipation there is not only a corresponding reduction in the photo-transistor current but also a reduction in the current transfer ratio of the opto-isolator. The combination of these effects results in a much more significant reduction in the output swing, which necessitate an increase in resistor 20, which in turn decreases the switching speed of the isolator circuit by a corresponding amount. Hence, the electrical isolator circuit of FIG. 1A presents an unacceptable compromise between power dissipation and switching speed.

Figure 1B:
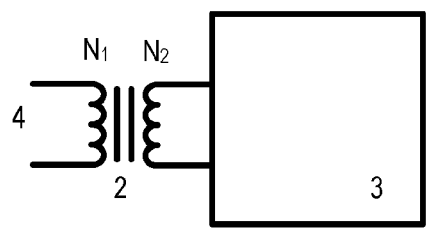
FIG. 1B is a circuit diagram of a second known electrical isolator circuit.

Another known electrical isolator circuit 1 is shown in FIG. 1B. The electrical isolator circuit 1 of FIG. 1B comprises a transformer 2 having a primary winding of N1 turns of conductor around a magnetic core and a secondary winding of N2 turns around the same core. A low voltage circuit 3 is connected across the secondary winding of the transformer 1. Upon application of a high voltage AC signal 4 across the primary winding, an output voltage, which is proportional to the high voltage AC signal, is developed across the secondary winding and thus provided to the low voltage circuit 3. The output voltage (Vout) is given by N2/N1×Vin, where Vin is the high voltage AC signal 4. Hence, the electrical isolator circuit 1 of FIG. 1B provides coupling of AC signals from the high voltage AC signal side to the low voltage side whilst providing for DC isolation between the high voltage AC signal side and the low voltage side.

A disadvantage of the electrical isolator circuit 1 of FIG. 1B when used with low frequency signals, such as for the coupling of domestic mains signals, is the typically large size of the transformer. The transformer is normally large on account of the need for: a large transformer core to prevent saturation; and a large number of windings to minimise losses. A further and associated disadvantage of the electrical isolator circuit 1 of FIG. 1B is its comparatively high cost.

Figure 2:
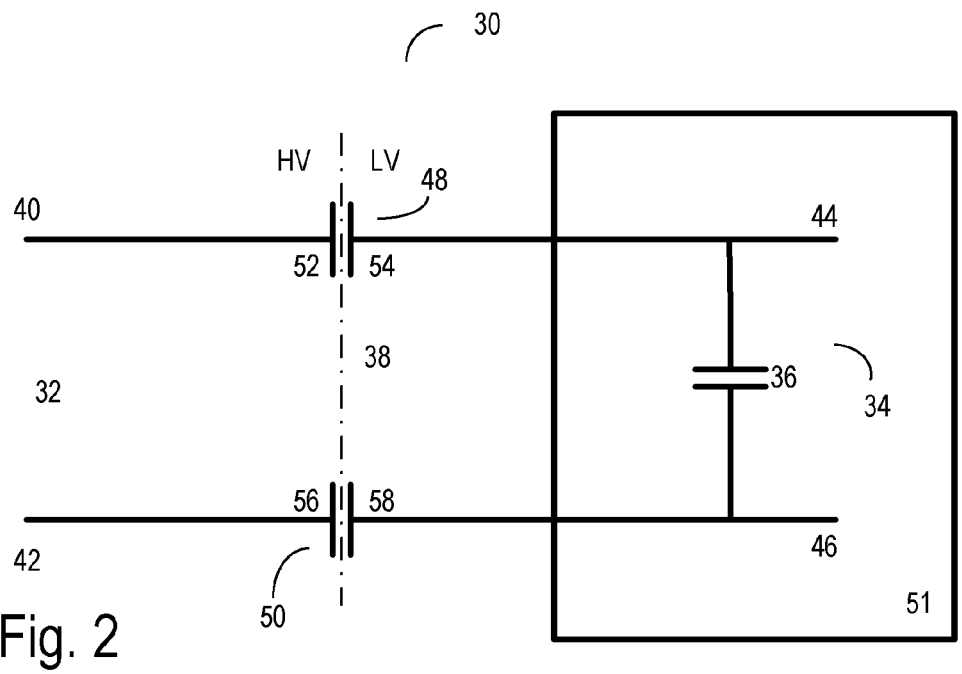
FIG. 2 is a circuit diagram of an electrical isolator circuit according to a first embodiment of the present invention.

FIG. 2 shows an electrical isolator circuit 30 comprising an input stage 32, an output stage 34 comprising a capacitive load 36, and a DC isolator 38. The input stage 32 has first 40 and second 42 inputs. The output stage 34 has first 44 and second 46 outputs. The DC isolator 38 comprises first 48 and second 50 capacitors. A first plate 52 of the first capacitor 48 is electrically connected to the first input 40 and the second plate 54 of the first capacitor 48 is electrically connected to a first side of the capacitive load 36. The first side of the capacitive load 36 constitutes the first output 44. A first plate 56 of the second capacitor 50 is electrically connected to the second input 42 and the second plate 58 of the second capacitor 50 is electrically connected to a second, opposing side of the capacitive load 36. The second side of the capacitive load 36 constitutes the second output 46. Although not shown in FIG. 2, the electrical isolator circuit also comprises a voltage source, which is operative to provide a domestic mains signal, such as 230 Vrms at 50 Hz, to the input stage. A detection circuit 51 is connected to the output stage at the first and second outputs. The form and function of the detection circuit depends on the application to hand. For example, the detection circuit may be a zero-crossing detector, where the integrity of the mains is being monitored, or an analogue to digital converter with associated processing circuitry, where the voltage level of the mains is being measured. The design of such circuits is within the scope of the ordinary design capabilities of the skilled person.

Figure 3:
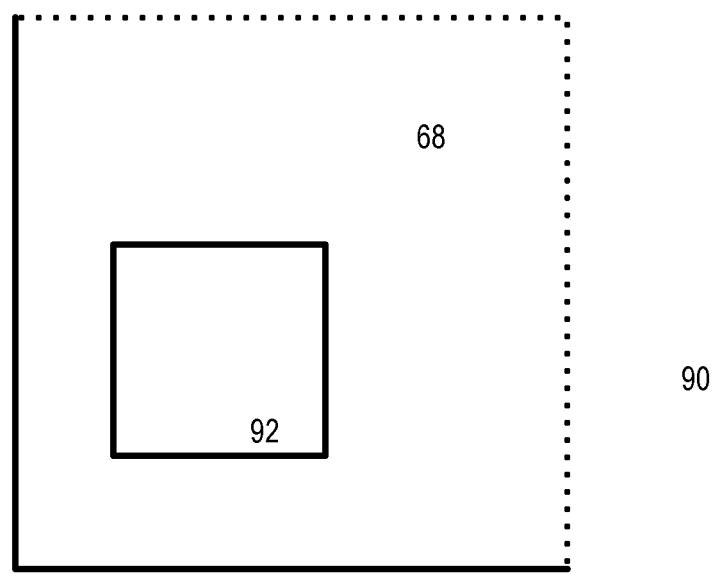
FIG. 3 provides plan view of a printed circuit board configured to form part of the circuit of FIG. 2.
Figure 4:
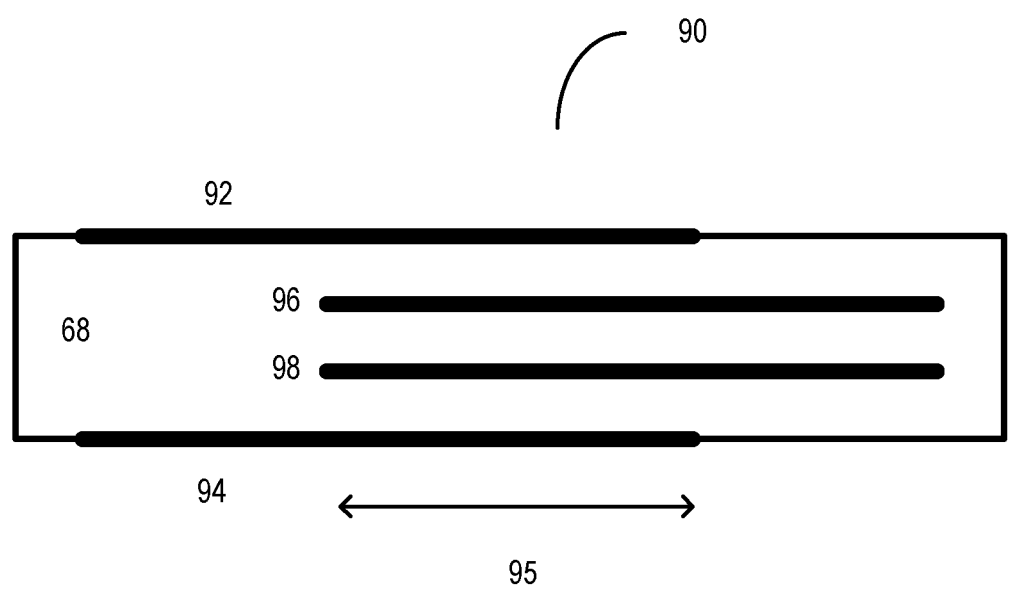
FIG. 4 provides a cross-section view of a printed circuit board configured to form part of the circuit of FIG. 2.

FIGS. 3 and 4 show respectively plan and cross-section views of the physical arrangement of capacitors 36, 48, 50 of FIG. 2. Each of the plates of the capacitor are defined by respective metal layers on the top and bottom surfaces 92, 94, and embedded within 96, 98, the printed circuit board 68. The metal layers are disposed such that they at least partially overlap and so that the non-conductive substrate 68 of the printed circuit board defines the dielectric of the capacitor. The formation of metal tracks and of larger area structures, such the metal layers of the first and second plates, on a printed circuit board substrate is a process that is well known to the skilled person. Alternatively, one or more capacitor plates are defined by metal layers embedded within the substrate. The provision of embedded metal tracks and of larger area structures, such the metal layers of the first and second plates, is a process that is well known to the skilled person.

The first capacitor 48 is defined by a first surface layer 92 on a first surface of the printed circuit board 68 and a first embedded layer 96 within the printed circuit board, these layers being at least partially overlapping such that each forms one of plates 52, 54 of the capacitor 48. Similarly, capacitor 50 is defined by a second surface layer 94 on a second surface of the printed circuit board 68 and a second embedded layer 98 within the printed circuit board, these layers being at least partially overlapping such that each forms one of plates 56, 58 of the capacitor 50. In each case the dielectric is defined by the part of the substrate 68 between the relevant layers. The capacitive electrical load 36 is defined by the first and second embedded layers 96, 98, which are spaced apart from each other, the dielectric again being defined by the substrate; more specifically, the part of the substrate between the first and second embedded layers 96, 98

In use, a domestic mains signal is applied to the input stage of 32 of the electrical isolator circuit 30 of FIG. 2. The configuration of the first 48 and second 50 capacitors is such that they form a potential divider with the electrical load 36 to provide an attenuated representation of the domestic mains voltage signal across the electrical load. For a domestic mains voltage signal of 230 Vrms at 50 Hz, a value of substantially 5 pF is used for each of the first and second capacitors along with an electrical load having a capacitance of substantially 200 pF to provide an attenuated voltage across the electrical load of about 5 volts.

Consequently it is desirable, using the arrangement of FIGS. 3 and 4, to obtain a load capacitor that has a larger capacitance than each of the first capacitor and the second capacitor. Consequently, the first 96 and second 98 embedded layers may be spaced apart from each other to an extent less than the spacing between each of the first surface layer 92 and the first embedded layer 96 and of the second surface layer 94 and the second embedded layer 98. Furthermore, as shown in FIG. 4, the two embedded layers 96, 98 may only partially overlap the two surface layers 92, 94. Therefore the area of overlap 95 of the plates making up the first and second capacitors 48, 50 is substantially smaller than the area of overlap (the entire plate area in this example) of the plates making up the load capacitor 36.

Figure 5:
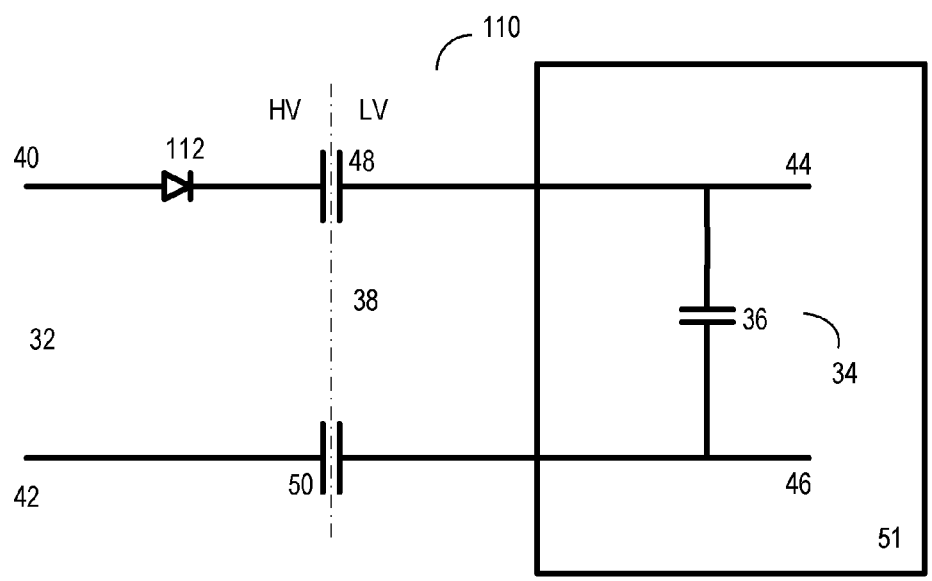
FIG. 5 is a circuit diagram of an electrical isolator according to the present invention having a first form of input stage.
Figure 6:
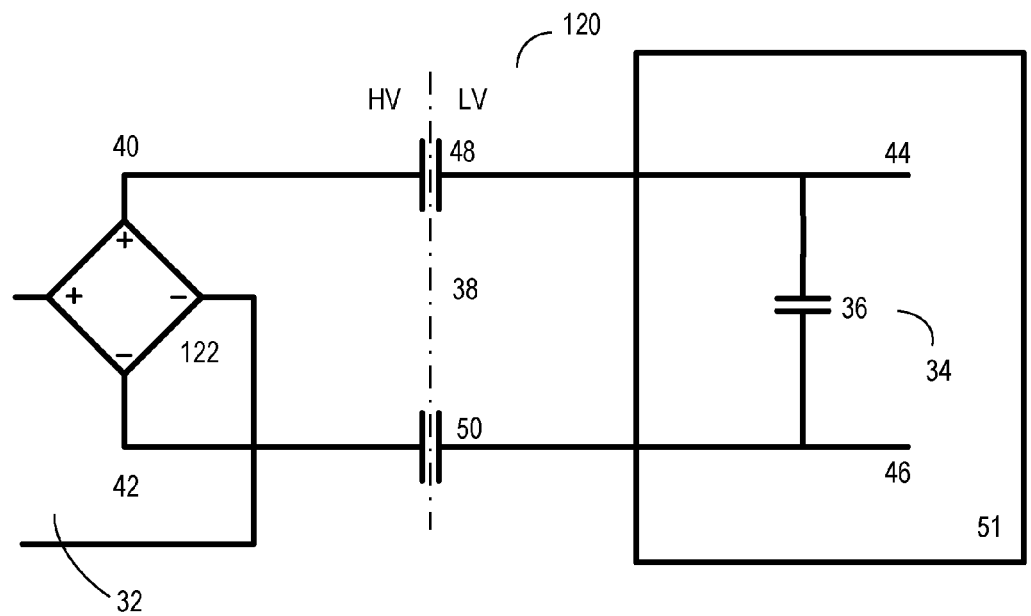
FIG. 6 is a circuit diagram of an electrical isolator according to the present invention having a second form of input stage.
Figure 7:
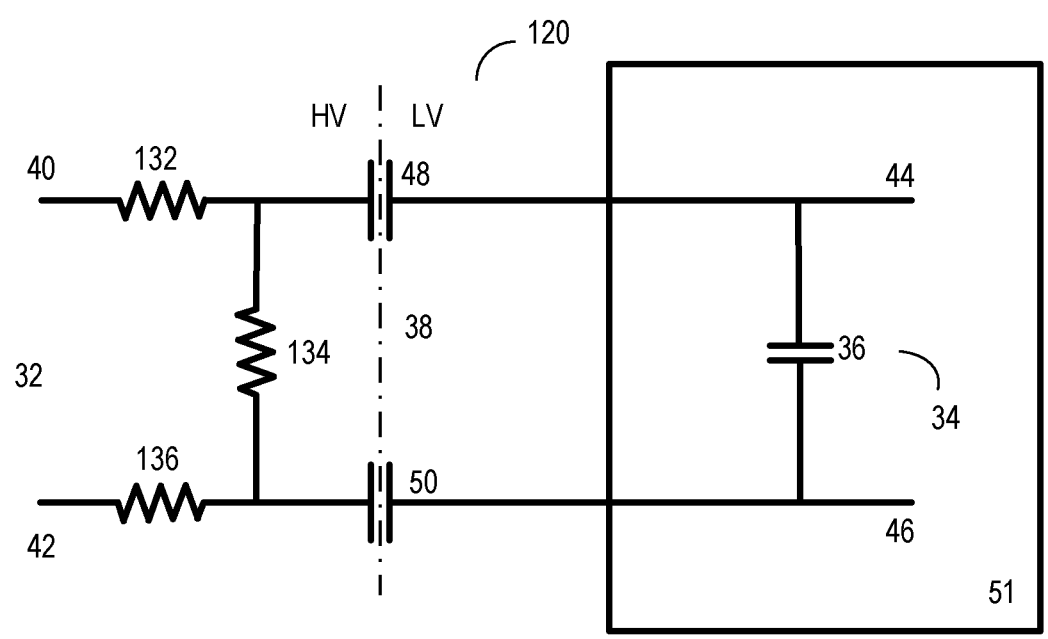
FIG. 7 is a circuit diagram of an electrical isolator according to the present invention having a third form of input stage.

FIGS. 5 to 7 show circuit diagrams of an electrical isolator according to the present invention having three different forms of input stage. Components in common with the circuit of FIG. 2 are identified with common reference numerals. The reader's attention is directed to the description given with reference to FIG. 2 for a description of the form and function of such components. The circuit 110 of FIG. 5 comprises a diode 112 in series with the first capacitor 48, the diode being operative as a rectifier. The circuit 120 of FIG. 5 comprises a bridge rectifier 122 between the input connections of the input stage 32 and the first and second capacitors 48, 50. The bridge rectifier 122 is operative to full wave rectify the domestic mains signal applied to the input stage. The circuit 130 of FIG. 7 comprises a resistive divider formed of series connected first 132, second 134 and third 136 resistors. The first plates of each of the first and second capacitors 48, 50 are connected to opposing ends of the second resistance 134 to thereby provide an attenuated form of the domestic mains voltage signal to the first and second capacitors. The values of the first 132, second 134 and third 136 resistors are chosen depending on the level of the domestic mains voltage signal and the voltage level desired to be applied to the first and second capacitors.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

The invention claimed is:

1. An electrical isolator circuit comprising:
   an input stage comprising first and second inputs, the input stage being configured to receive an input voltage signal;
   an output stage comprising first and second outputs electrically connected across a load capacitor; and
   a DC isolator comprising a first capacitor between said first input and said first output and a second capacitor between said second input and said second output; wherein
   first and second plates of each of the first, second and load capacitors are defined by conductive layers of a printed circuit board and the dielectric of each of the first, second and load capacitors are defined by a non-conducting part of the printed circuit board, wherein said first, second and load capacitors are defined by four of said conductive layers, all of which at least partially overlap with each other, such that one of said conductive layers defines a first of said plates of said load capacitor and one of said plates of said first capacitor, and another of said conductive layers defines a second of said plates of said load capacitor and one of said plates of said second capacitor.

2. An electrical isolator circuit according to claim 1, wherein a first plate of the first capacitor is defined by a first surface layer on a first surface of the printed circuit board, the first plate of the second capacitor is defined by a second surface layer on a second opposite surface of the printed circuit board, the second plate of the first capacitor and the first plate of the load capacitor are both defined by a first embedded layer within the printed circuit board and the second plate of the second capacitor and the second plate of the load capacitor are both defined by a second embedded layer, the first and second embedded layers being spaced apart from each other.

3. An electrical isolator circuit according to claim 2, wherein said first and second surface layers only partially overlap said first and second embedded layers, while said first and second embedded layers substantially totally overlap each other, such that the area of overlap of the layers which define the first and second capacitors is smaller than the area of overlap of the layers which define the load capacitor.

4. An electrical isolator circuit according to claim 2, wherein the first and second embedded layers are spaced apart from each other to an extent less than the spacing between each of the first surface layer and the first embedded layer and of the second surface layer and the second embedded layer.

5. An electrical isolator circuit according to claim 2, wherein said embedded layers each have similar areas and dimensions.

6. An electrical isolator circuit according to claim 1, wherein the first and second capacitors are configured such that the first and second capacitors form a potential divider with the load capacitor.

7. An electrical isolator circuit according to claim 1, wherein the input stage is configured to receive a high voltage AC signal having a frequency of less than 500 Hz.

8. An electrical isolator circuit according to claim 7, wherein the high voltage AC signal is an AC voltage of 50 Vrms or greater.

9. An electrical isolator circuit according to claim 1, wherein the output stage is operable at a low voltage of at least one of an AC voltage of less than 50 Vrms and a DC voltage of less than 120 V.

10. An electrical isolator circuit according to claim 9, wherein the low voltage is a DC voltage of less than substantially 15 volts.

11. An electrical isolator circuit according to claim 1, wherein each of the first and second capacitors has a capacitance of less than 100 pF.

12. An electrical isolator circuit according to claim 1, wherein the load capacitor has a capacitance of between substantially 20 pF and substantially 1 nF.

13. An electrical isolator circuit according to claim 1, wherein the input stage comprises a resistive divider operative to reduce a voltage level of a high voltage AC signal applied to the input stage.

14. An electrical isolator circuit according to claim 1, wherein the electrical isolator circuit further comprises an electrical source that is operative to provide a high voltage AC signal to the input stage.

15. An electrical isolator circuit comprising:
a rectifier configured to receive a high voltage AC signal and to rectify the high voltage AC signal to produce a rectified high voltage input voltage signal;
an input stage comprising first and second inputs, the input stage configured to receive the rectified high voltage input voltage signal;
an output stage comprising first and second outputs electrically connected across a load capacitor; and
a DC isolator comprising a first capacitor between said first input and said first output and second capacitor between said second input and said second output; wherein
first and second plates of each of the first, second and load capacitors are defined by conductive layers of a printed circuit board and the dielectric of each of the first, second and load capacitors are defined by a non-conducting part of the printed circuit board.

16. An electrical isolator circuit according to claim 15, wherein said first, second and load capacitors are defined by four of said conductive layers, all of which at least partially overlap with each other, such that one of said conductive layers defines a first of said plates of said load capacitor and one of said plates of said first capacitor, and another of said conductive layers defines a second of said plates of said load capacitor and one of said plates of said second capacitor.

17. An electrical isolator circuit according to claim 16, wherein a first plate of the first capacitor is defined by a first surface layer on a first surface of the printed circuit board, the first plate of the second capacitor is defined by a second surface layer on a second opposite surface of the printed circuit board, the second plate of the first capacitor and the first plate of the load capacitor are both defined by a first embedded layer within the printed circuit board and the second plate of the second capacitor and the second plate of the load capacitor are both defined by a second embedded layer, the first and second embedded layers being spaced apart from each other.

18. An electrical isolator circuit according to claim 17, wherein said first and second surface layers only partially overlap said first and second embedded layers, while said first and second embedded layers substantially totally overlap each other, such that the area of overlap of the layers which define the first and second capacitors is smaller than the area of overlap of the layers which define the load capacitor.

19. An electrical isolator circuit according to claim 17, wherein the first and second embedded layers are spaced apart from each other to an extent less than the spacing between each of the first surface layer and the first embedded layer and of the second surface layer and the second embedded layer.

20. An electrical isolator circuit according to any of claims 17, wherein said embedded layers each have similar areas and dimensions.

* * * * *